(12) United States Patent
Tsuruyama et al.

(10) Patent No.: US 10,205,393 B2
(45) Date of Patent: *Feb. 12, 2019

(54) COMPARATOR CIRCUIT, POWER SUPPLY CONTROL IC, AND SWITCHING POWER SUPPLY DEVICE

(71) Applicant: Rohm Co., Ltd., Kyoto (JP)

(72) Inventors: Genki Tsuruyama, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/918,218

(22) Filed: Mar. 12, 2018

(65) Prior Publication Data

US 2018/0205316 A1 Jul. 19, 2018

Related U.S. Application Data

(63) Continuation of application No. 15/459,100, filed on Mar. 15, 2017, now Pat. No. 9,954,442.

(30) Foreign Application Priority Data

Mar. 17, 2016 (JP) .................. 2016-054118

(51) Int. Cl.
*H02M 3/157* (2006.01)
*H02M 3/158* (2006.01)
*G01R 19/00* (2006.01)
*H02M 3/156* (2006.01)

(52) U.S. Cl.
CPC ...... *H02M 3/1588* (2013.01); *G01R 19/0038* (2013.01); *H02M 3/156* (2013.01)

(58) Field of Classification Search
CPC ...... H02M 3/135; H02M 3/155–3/158; H02M 1/32; G05F 1/40; G05F 1/44
USPC .......... 323/265, 268, 282–285, 351
See application file for complete search history.

(56) References Cited

U.S. PATENT DOCUMENTS

| 9,819,895 | B2 | 11/2017 | Tateishi |
| 9,852,699 | B2* | 12/2017 | Im ........................... G09G 3/342 |
| 9,935,553 | B2* | 4/2018 | Svorc .................. H02M 3/1588 |
| 9,954,442 | B2* | 4/2018 | Tsuruyama ......... H02M 3/1588 |
| 2007/0236971 | A1 | 10/2007 | Chen |
| 2008/0079405 | A1 | 4/2008 | Shimizu |

(Continued)

FOREIGN PATENT DOCUMENTS

JP 2010-035140 2/2010

*Primary Examiner* — Adolf Berhane
(74) *Attorney, Agent, or Firm* — Fish & Richardson P.C.

(57) ABSTRACT

A comparator circuit includes a first comparator, a second comparator, and a logic portion. The logic portion adjust a variable reference voltage input to the second comparator to become close to a reference voltage input to the first comparator, during a period from a time point when reverse current of current flowing in a coil disposed in a switching power supply device is detected in a state where a first comparison signal is output as a comparison signal while the first comparator and the second comparator are operated, until a first predetermined period of time elapses in a state where switching operation of the switching power supply device is stopped (excluding a period from a time point when the reverse current is detected until a second predetermined period of time shorter than the first predetermined period of time elapses).

18 Claims, 10 Drawing Sheets

(56) References Cited

U.S. PATENT DOCUMENTS

| | | |
|---|---|---|
| 2010/0001888 A1 | 1/2010 | Nakajima |
| 2010/0066328 A1 | 3/2010 | Shimizu |
| 2010/0134085 A1 | 6/2010 | Nishida |
| 2013/0063106 A1 | 3/2013 | Nishida |
| 2013/0063108 A1 | 3/2013 | Nishida |
| 2014/0340066 A1 | 11/2014 | Chen |
| 2016/0036322 A1 | 2/2016 | Miyame |
| 2016/0301309 A1 | 10/2016 | Tateishi |
| 2016/0322902 A1 | 11/2016 | Tsuruyama |

* cited by examiner

COMPARATOR CIRCUIT, POWER SUPPLY CONTROL IC, AND SWITCHING POWER SUPPLY DEVICE

CROSS-REFERENCE TO RELATED APPLICATIONS

This nonprovisional application claims priority under 35 U.S.C. § 119(a) on Patent Application No. 2016-054118 filed in Japan on Mar. 17, 2016, the entire contents of which are hereby incorporated by reference.

BACKGROUND OF THE INVENTION

Field of the Invention

The present invention relates to a comparator circuit having automatic offset correction function between a plurality of comparators, a power supply control IC using the comparator circuit, and a switching power supply device.

Description of Related Art

Conventionally, there is known a comparator circuit in which a plurality of comparators having different characteristics are selectively used according to a situation.

However, in a conventional comparator circuit, if the comparators have different input offsets, logical switching timing of comparison signal is different between the comparators even if the same input signal is compared with the same reference voltage. As a result, there is a problem that an output accuracy of the entire comparator circuit is deteriorated.

In order to solve the problem described above, it is effective to perform a correction process for eliminating the difference between input offsets of the comparators. However, if the correction process is performed only when the comparator circuit is activated, there is a problem that input offsets of the comparators may differ from each other due to change in external environment (for example, power supply voltage, temperature, or the like) after the correction process. In addition, if the correction process is performed only when the comparator circuit is activated, there is also a problem that if inappropriate correction is performed in the correction process when it is activated, different input offsets of the comparators are kept.

Note that the offset adjusting method disclosed in JP-A-2010-35140 has a structure in which output of the first comparator is compared with output of the second comparator, and offset amounts having opposite polarities are set to the comparators according to a result of the comparison, and the structure is essentially different from the structure of the present invention.

SUMMARY OF THE INVENTION

It is an object of the present invention to provide a comparator circuit that can return to setting in which output accuracy is not deteriorated even after being deviated from the setting and can selectively use a plurality of comparators having different characteristics, a power supply control IC using the comparator circuit, and a switching power supply device.

An example of a comparator circuit disclosed in this specification is a comparator circuit, which is disposed in a nonlinear control type switching power supply device arranged to generate a desired output voltage from an input voltage, and receives the output voltage or a feedback voltage corresponding thereto as an input signal. The comparator circuit includes a first comparator arranged to compare the input signal with a reference voltage so as to generate a first comparison signal; a second comparator arranged to compare the input signal with a variable reference voltage so as to generate a second comparison signal; a variable reference voltage generating portion arranged to generate the variable reference voltage; and a logic portion arranged to output one of the first comparison signal and the second comparison signal as a comparison signal. The logic portion adjusts the variable reference voltage to become close to the reference voltage during a period from a time point when reverse current of current flowing in a coil disposed in the switching power supply device is detected in a state where the first comparison signal is output as the comparison signal while the first comparator and the second comparator are operated, until a first predetermined period of time elapses in a state where switching operation of the switching power supply device is stopped (excluding a period from a time point when the reverse current is detected until a second predetermined period of time shorter than the first predetermined period of time elapses).

Another example of the comparator circuit disclosed in this specification is a comparator circuit, which is disposed in a nonlinear control type switching power supply device arranged to generate a desired output voltage from an input voltage, and receives the output voltage or a feedback voltage corresponding thereto as an input signal. The comparator circuit includes a first comparator arranged to compare the input signal with a reference voltage so as to generate a first comparison signal; a second comparator arranged to compare the input signal with a variable reference voltage so as to generate a second comparison signal; a variable reference voltage generating portion arranged to generate the variable reference voltage; and a logic portion arranged to output one of the first comparison signal and the second comparison signal as a comparison signal. The logic portion adjusts the variable reference voltage to become close to the reference voltage when switching from a state where the second comparison signal is output as the comparison signal while the first comparator is stopped and the second comparator is operated to a state where the first comparison signal is output as the comparison signal while the first comparator and the second comparator are operated.

In addition, a power supply control IC disclosed in this specification includes integration of a ripple injection circuit arranged to superimpose a ripple voltage simulating coil current to an output voltage or a divided voltage thereof so as to generate a feedback voltage; a reference voltage generating circuit arranged to generate a predetermined reference voltage; a main comparator arranged to compare the feedback voltage with the reference voltage so as to generate a comparison signal; a one-shot pulse generating circuit arranged to generate a one-shot pulse in a set signal in response to the comparison signal; an RS flip-flop arranged to set an output signal to a first logical level in response to the set signal and to reset the output signal to a second logical level in response to a reset signal; an on-time setting circuit arranged to generate a one-shot pulse in the reset signal at a time point when a predetermined on-time elapses after the output signal is set to the first logical level; a gate driver circuit arranged to generate drive signals for an output transistor and a synchronous rectification transistor in response to the output signal; and a reverse current detecting circuit arranged to detect reverse current of the coil current so as to forcibly turn off the synchronous rectification transistor, in which the power supply control IC includes the comparator circuit having any one of the structures described above as the main comparator.

In addition, a switching power supply device disclosed in this specification includes the power supply control IC having the structure described above, and a switch output stage arranged to generate an output voltage from an input voltage, a part or a whole of the switch output stage being externally connected to the power supply control IC.

Meanings and effects of the present invention will become apparent from the description of embodiment given below. However, the embodiment described below is merely an example of the embodiment of the present invention. The present invention and meanings of terms of structural elements are not limited to those described below in the embodiment.

DETAILED DESCRIPTION OF THE PREFERRED EMBODIMENTS

<Switching Power Supply Device>

Figure 1:
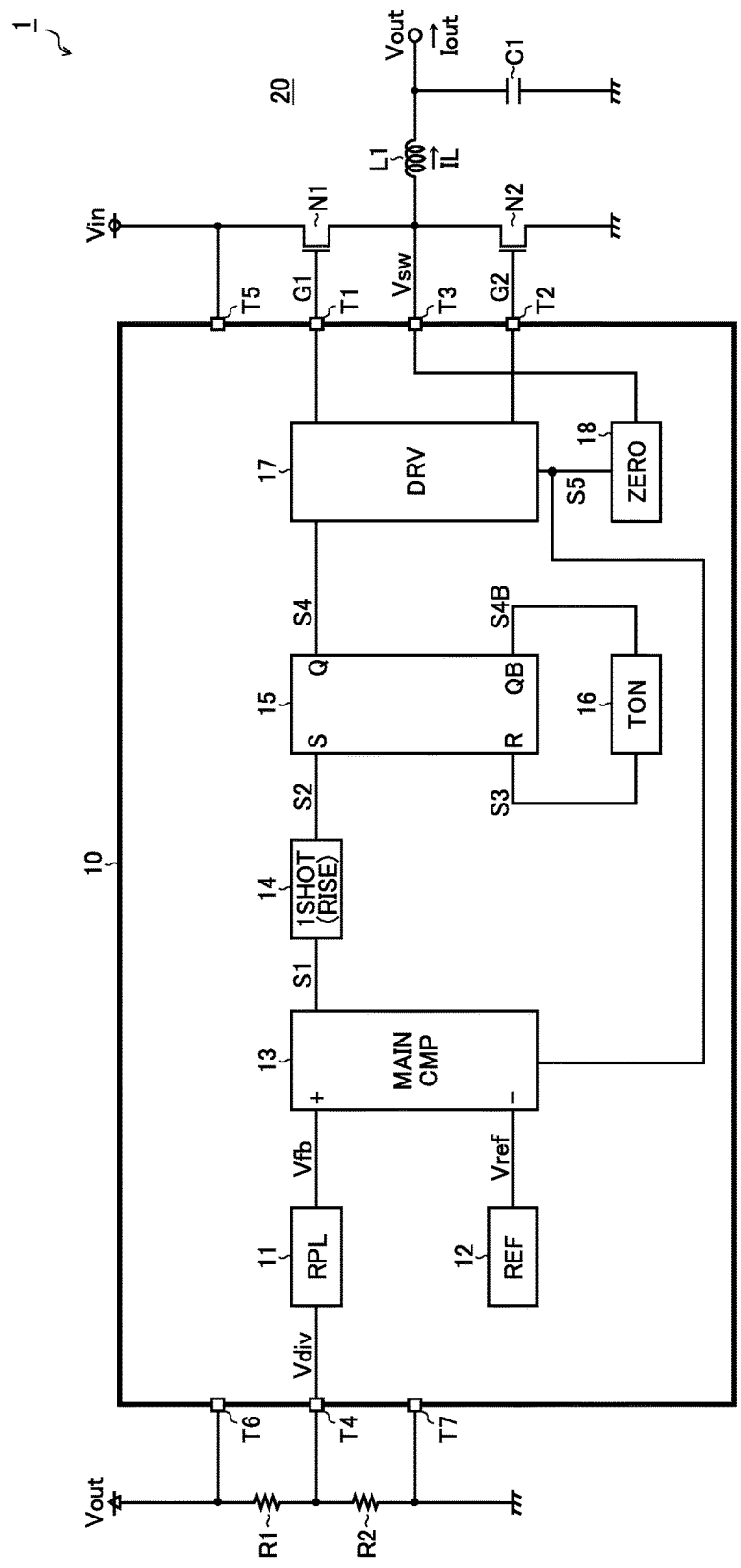
FIG. 1 is a block diagram illustrating an overall structure of a switching power supply device.

FIG. 1 is a block diagram illustrating an overall structure of a switching power supply device. A switching power supply device 1 of this structural example is a step-down type DC/DC converter, which generates an output voltage Vout from an input voltage Vin by a nonlinear control method (fixed on-time with bottom detection method). The switching power supply device 1 includes a semiconductor device 10, and a switch output stage 20 constituted of various discrete components (N-channel metal oxide semiconductor (MOS) field-effect transistors N1 and N2, a coil L1, a capacitor C1, and resistors R1 and R2) connected externally to the semiconductor device 10.

The semiconductor device 10 is a main body (so-called power supply control IC) that integrally controls overall operation of the switching power supply device 1. The semiconductor device 10 has external terminals T1 to T7 (an upper-side gate terminal T1, a lower-side gate terminal T2, a switch terminal T3, a feedback terminal T4, an input voltage terminal T5, an output voltage terminal T6, and a ground terminal T7) as means to establish electrical connection with the outside of the device.

The external terminal T1 is connected to the gate of the transistor N1. The external terminal T2 is connected to the gate of the transistor N2. The external terminal T3 is connected to the application terminal of a switch voltage Vsw (the connection node between the source of the transistor N1 and the drain of the transistor N2). The external terminal T4 is connected to the application terminal of a divided voltage Vdiv (the connection node between the resistor R1 and the resistor R2). The external terminal T5 is connected to the application terminal of the input voltage Vim. The external terminal T6 is connected to the application terminal of the output voltage Vout. The external terminal T7 is connected to the ground terminal.

Next, connection relationship of the discrete components connected externally to the semiconductor device 10 is described. The drain of the transistor N1 is connected to the application terminal of the input voltage Vin. The source of the transistor N2 is connected to the ground terminal. The source of the transistor N1 and the drain of the transistor N2 are both connected to a first terminal of the coil L1. A second terminal of the coil L1 and a first terminal of the capacitor C1 are both connected to the application terminal of the output voltage Vout. A second terminal of the capacitor C1 is connected to the ground terminal. The resistor R1 and the resistor R2 are connected in series between the application terminal of the output voltage Vout and the ground terminal.

The transistor N1 is an output transistor that is on-off controlled according to a gate signal G1 input from the external terminal T1. The transistor N2 is a synchronous rectification transistor that is on-off controlled according to a gate signal G2 input from the external terminal T2. Note that a diode may be used instead of the transistor N2 as a rectifier element. In addition, the transistors N1 and N2 may be included in the semiconductor device 10. The coil L1 and the capacitor C1 function as a rectification smoothing portion that rectifies and smooths the switch voltage Vsw of a rectangular wave at the external terminal T3 so as to generate the output voltage Vout. The resistors R1 and R2 function as a divided voltage generating portion that divides the output voltage Vout so as to generate the divided voltage Vdiv. However, if the output voltage Vout is within an input dynamic range of a ripple injection circuit 11 (or a main comparator 13), the divided voltage generating portion may be eliminated.

Next, an internal structure of the semiconductor device 10 is described. In the semiconductor device 10, there are integrated the ripple injection circuit 11, a reference voltage generating circuit 12, the main comparator 13, a one-shot pulse generating circuit 14, an RS flip-flop 15, an on-time setting circuit 16, a gate driver circuit 17, and a reverse current detecting circuit 18.

The ripple injection circuit 11 adds a ripple voltage Vrpl (a pseudo ripple component that simulates coil current IL flowing in the coil L1) to the divided voltage Vdiv so as to generate a feedback voltage Vfb (=Vdiv+Vrpl). By introducing this ripple injection technique, even if the ripple component of the output voltage Vout (therefore the divided voltage Vdiv) is not so large, stable switching control can be performed, and hence it is possible to use a laminated ceramic capacitor or the like having a small ESR as the capacitor C1. However, if the ripple component of the output voltage Vout is sufficiently large, it is possible to eliminate the ripple injection circuit 11.

The reference voltage generating circuit 12 generates a predetermined reference voltage Vref.

The main comparator 13 compares the feedback voltage Vfb input to a noninverting input terminal (+) with a reference voltage Vref input to an inverting input terminal (−) so as to generate a comparison signal S1. The comparison signal S1 becomes high level when the feedback voltage Vfb is higher than the reference voltage Vref, and it becomes low level when the feedback voltage Vfb is lower than the reference voltage Vref.

The one-shot pulse generating circuit 14 generates a one-shot pulse (e.g. a falling pulse) in a set signal S2 by a trigger of a falling edge of the comparison signal S1.

The RS flip-flop 15 sets an output signal S4 to high level at a pulse edge (e.g. a falling edge) of the set signal S2 input to a set terminal (S), and it resets the output signal S4 to low level at a pulse edge (e.g. a falling edge) of a reset signal S3 input to a reset terminal (R).

The on-time setting circuit 16 generates a one-shot pulse (e.g. a falling pulse) in the reset signal S3 after a predetermined on-time Ton elapses after an inverted output signal S4B of the RS flip-flop 15 (i.e., a logically inverted signal of the output signal S4) is decreased to low level.

The gate driver circuit 17 generates the gate signals G1 and G2 according to the output signal S4 of the RS flip-flop 15 so as to switch the transistors N1 and N2 in a complementary manner. Note that the language "in a complementary manner" used in this specification means not only the case where on and off of the transistors N1 and N2 are completely opposite, but also the case where a delay time is provided (the case where a so-called simultaneous off period (dead time) is provided) between on and off timings of the transistors N1 and N2 for preventing through current.

The reverse current detecting circuit 18 monitors reverse current of the coil current IL (coil current IL flowing from the coil L1 via the transistor N2 to the ground terminal) so as to generate a reverse current detection signal S5. The reverse current detection signal S5 is latched to high level (a logical level when the reverse current is detected) at the time point when the reverse current of the coil current IL is detected, and it is reset to low level (a logical level when the reverse current is not detected) at a rising edge of the gate signal G1 in the next period. Note that Note that, as a method of monitoring the reverse current of the coil current IL, for example, it is preferred to detect a zero-cross point at which the switch voltage Vsw is switched from negative to positive during the on-period of the transistor N2. When the reverse current detection signal S5 is high level, the gate driver circuit 17 generates the gate signal G2 so as to forcibly turn off the transistor N2 regardless of the output signal S4.

Note that the ripple injection circuit 11, the reference voltage generating circuit 12, the main comparator 13, the one-shot pulse generating circuit 14, the RS flip-flop 15, the on-time setting circuit 16, the gate driver circuit 17, and the reverse current detecting circuit 18 described above function as a switching control circuit of a nonlinear control method (fixed on-time with bottom detection method in this structural example), which performs on-off control of the transistors N1 and N2 according to a comparison result between the feedback voltage Vfb and the reference voltage Vref, so as to generate the output voltage Vout from the input voltage Vin.

<Switching Operation>

Figure 2:
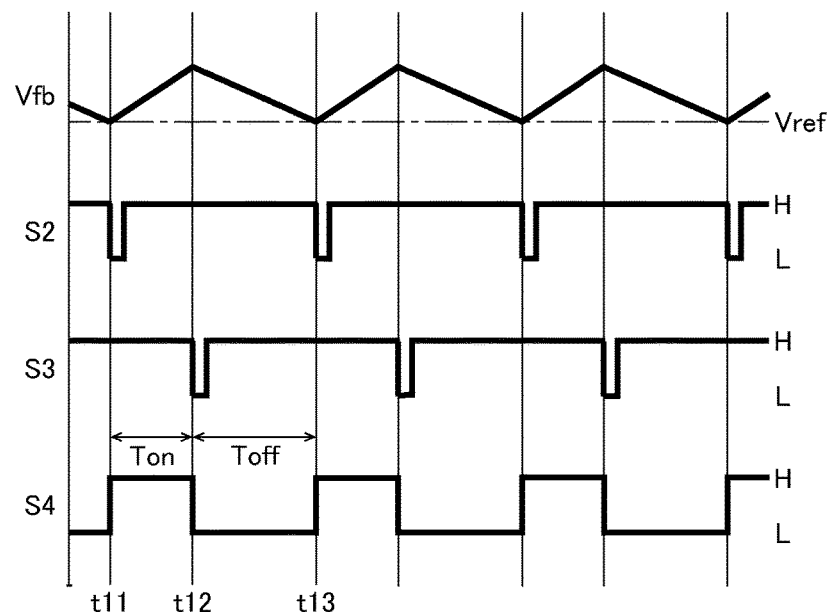
FIG. 2 is a timing chart illustrating a switching operation with heavy load.

FIG. 2 is a timing chart illustrating a switching operation with heavy load (continuous current mode), in which the feedback voltage Vfb, the set signal S2, the reset signal S3, and the output signal S4 are shown in order from the upper side.

When the feedback voltage Vfb drops to the reference voltage Vref at time point t11, the set signal S2 is decreased to low level, and the output signal S4 is changed to high level. Therefore, the transistor N1 is turned on so that the feedback voltage Vfb is changed to increase.

After that, the on-time Ton elapses and when the reset signal S3 is decreased to low level at time point t12, the output signal S4 is changed to low level. Therefore, the transistor N1 is turned off so that the feedback voltage Vfb is changed to decrease again.

The gate driver circuit 17 generates the gate signals G1 and G2 according to the output signal S4 and uses the gate signals G1 and G2 to perform on-off control of the transistors N1 and N2. Specifically, when the output signal S4 is high level, basically, the gate signal G1 becomes high level so that the transistor N1 is turned on, while the gate signal G2 becomes low level so that the transistor N2 is turned off. On the contrary, when the output signal S4 is low level, basically, the gate signal G1 becomes low level so that the transistor N1 is turned off, while the gate signal G2 becomes high level so that the transistor N2 is turned on.

With the on-off control of the transistors N1 and N2 described above, the switch voltage Vsw having a rectangular waveform appears at the external terminal T3. The switch voltage Vsw is rectified and smoothed by the coil L1 and the capacitor C1 so that the output voltage Vout is generated. Note that the output voltage Vout is divided by the resistors R1 and R2 so that the divided voltage Vdiv (therefore the feedback voltage Vfb) is generated. By this output feedback control, the switching power supply device 1 generates the desired output voltage Vout from the input voltage Vin with the very simple structure.

<Reverse Current Cut-Off Operation>

Figure 3:
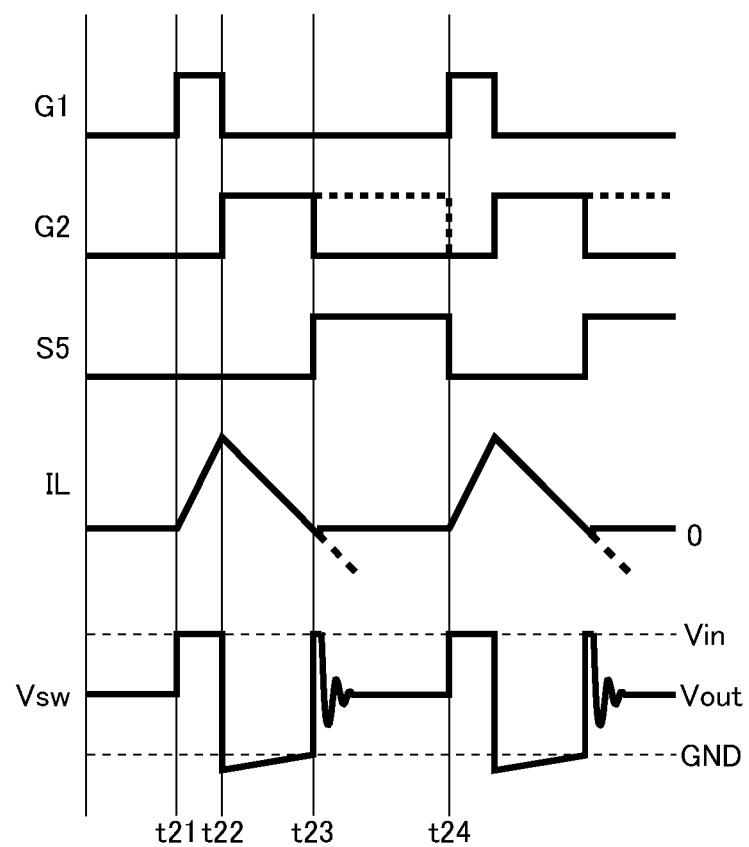
FIG. 3 is a timing chart illustrating a reverse current cut-off operation with light load.

FIG. 3 is a timing chart illustrating a reverse current cut-off operation with light load (discontinuous current mode), in which the gate signals G1 and G2, the reverse current detection signal S5, the coil current IL, and the switch voltage Vsw are shown in order from the upper side.

From time point t21 to time point t22, the gate signal G1 is high level while the gate signal G2 is low level, and hence the transistor N1 is turned on while the transistor N2 is turned off. Therefore, from the time point t21 to the time point t22, the switch voltage Vsw is increased substantially to the input voltage Vin so that the coil current IL is being increased.

At the time point t22, when the gate signal G1 is decreased to low level while the gate signal G2 is increased to high level, the transistor N1 is turned off so that the transistor N2 is turned on. Therefore, the switch voltage Vsw is decreased to a negative voltage (=GND−IL×RN2, where RN2 is the on resistance of the transistor N2), and the coil current IL is changed to decrease.

Here, in heavy load with sufficiently large output current Iout flowing in the load, the amount of energy stored in the coil L1 is large, and hence the coil current IL continues to flow to the load without becoming negative until time point t24 at which the gate signal G1 is increased to high level again, so that the switch voltage Vsw is maintained at a negative voltage. On the other hand, in light load with small output current Iout flowing in the load, the amount of energy stored in the coil L1 is small, and hence the coil current IL becomes negative at time point t23. Thus, the reverse current of the coil current IL is generated, and the polarity of the switch voltage Vsw is changed from negative to positive. In this state, the charge stored in the capacitor C1 is returned to the input side via the coil L1, and hence efficiency in light load is decreased.

Therefore, the switching power supply device 1 detects the reverse current of the coil current IL (inversion of the switch voltage Vsw) using the reverse current detecting circuit 18, so as to forcibly turn off the transistor N2 in the high level period of the reverse current detection signal S5 (time point t23 to time point t24). With this structure, the reverse current of the coil current IL can be quickly cut off, and hence the efficiency decrease in light load can be canceled.

<Main Comparator>

Figure 4:
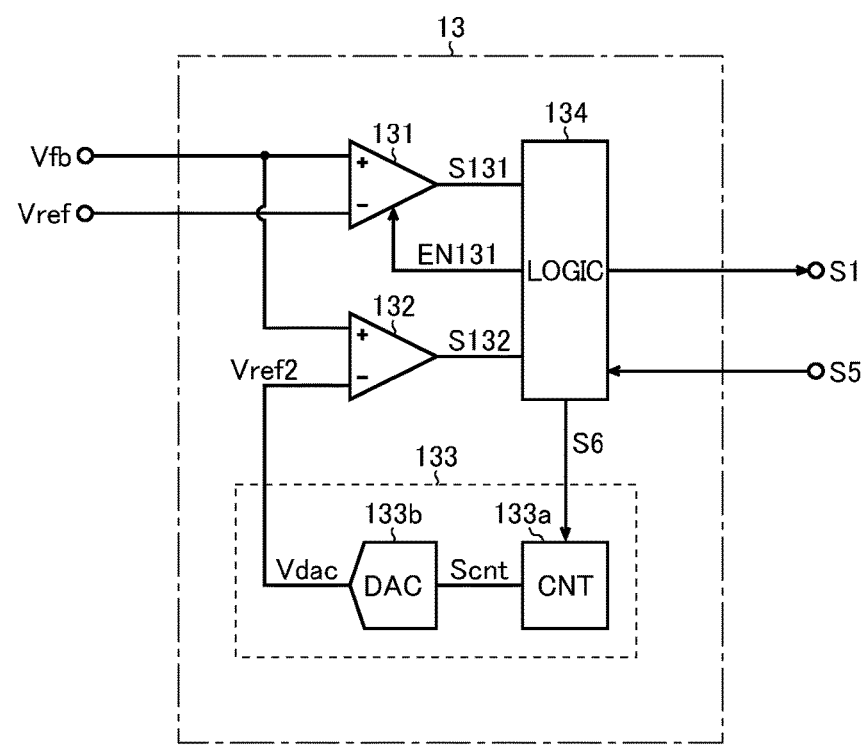
FIG. 4 is a block diagram illustrating a structural example of a main comparator 13.

FIG. 4 is a block diagram illustrating a structural example of the main comparator 13. The main comparator 13 of this structural example is a comparator circuit that compares the feedback voltage Vfb (corresponding to the input signal) with the reference voltage Vref so as to generate the comparison signal S1 and includes a first comparator 131, a second comparator 132, a variable reference voltage generating portion 133, and a logic portion 134.

The first comparator 131 compares the feedback voltage Vfb input to a noninverting input terminal (+) with the reference voltage Vref input to the inverting input terminal (−) so as to generate a first comparison signal S131. The first comparison signal S131 becomes high level when the feedback voltage Vfb is higher than the reference voltage Vref and becomes low level when the feedback voltage Vfb is lower than the reference voltage Vref.

In addition, the first comparator 131 is enabled or disabled according to an enable signal EN131 input from the logic portion 134. Specifically, the first comparator 131 is enabled when the enable signal EN131 is at a first logical level (i.e., logical level in enabled state) and is disabled when the enable signal EN131 is at a second logical level (i.e., logical level in disabled state). Note that when the first comparator 131 is disabled, power consumption thereof can be substantially zero.

The second comparator 132 compares the feedback voltage Vfb input to the noninverting input terminal (+) with a variable reference voltage Vref2 input to the inverting input terminal (−) so as to generate a second comparison signal S132. The second comparison signal S132 becomes high level when the feedback voltage Vfb is higher than the variable reference voltage Vref2 and becomes low level when the feedback voltage Vfb is lower than the variable reference voltage Vref2. Note that the second comparator 132 continues to operate after the semiconductor device 10 is activated, unlike the first comparator 131.

Note that response speed of the first comparator 131 is higher than that of the second comparator 132. In addition, power consumption of the second comparator 132 is much smaller than that of the first comparator 131. In other words, the first comparator 131 is a high speed response type having higher priority in improvement of the response speed than in power consumption reduction, and the second comparator 132 is a super low power consumption type having higher priority in reduction of the power consumption than improvement of the response speed.

The variable reference voltage generating portion 133 is a circuit portion that generates the variable reference voltage Vref2 and includes an up/down counter 133a and a DAC 133b.

The up/down counter 133a performs one of a count-up operation of incrementing a counter value Scnt, a count-down operation of decrementing the counter value Scnt, and a count-stop operation of keeping the counter value Scnt, in accordance with a control signal S6 input from the logic portion 134. Then, the up/down counter 133a outputs the counter value Scnt to the DAC 133b.

The DAC 133b converts the digital counter value Scnt to an analog voltage Vdac and outputs the analog voltage Vdac as the variable reference voltage Vref2. Therefore, the variable reference voltage Vref2 increases step by step along with the increment of the counter value Scnt and decreases step by step along with the decrement of the counter value Scnt.

The logic portion 134 outputs one of the first comparison signal S131 and the second comparison signal S132 as the comparison signal S1. Note that, whilee the logic portion 134 outputs the first comparison signal S131 as the comparison signal S1, it sets the enable signal EN131 to the first logical level (i.e., logical level in enabled state) so as to activate the first comparator 131. On the other hand, while the logic portion 134 outputs the second comparison signal S132 as the comparison signal S1, it sets the enable signal EN131 to the second logical level (i.e., logical level in disabled state) so as to stop the first comparator 131.

More specifically, the logic portion 134 allows the first comparator 131 to operate in a period while the reverse current detection signal S5 is low level and outputs the first comparison signal S131 as the comparison signal S1. In addition, the logic portion 134 allows the first comparator 131 to operate also in a period after the reverse current detection signal S5 is changed from low level to high level until a first predetermined period of time (for example, 8 μs) is elapsed, and it outputs the first comparison signal S131 as the comparison signal S1. On the other hand, if high level of the reverse current detection signal S5 continues for over the first predetermined period of time (for example, 8 μs) after the reverse current detection signal S5 is changed from low level to high level, the logic portion 134 stops the first comparator 131 thereafter until the reverse current detection signal S5 is changed from high level to low level and outputs the second comparison signal S132 as the comparison signal S1. In other words, if the output voltage Vout is sufficient so that both the transistors N1 and N2 are OFF state for a period exceeding a first predetermined period of time (for example, 8 μs), the first comparator 131 is stopped for the excess period so that power consumption of the main comparator 13 can be reduced. In this way, the logic portion 134 has a function of selectively using the first comparator 131 for high speed response and the second comparator 132 for super low power consumption in accordance with a situation (load state).

However, if input offset of the first comparator 131 is different from that of the second comparator 132, logical switching timing of the comparison signal S1 is different depending on which one of the first comparator 131 and the second comparator 132 is used. As a result, output accuracy of the entire main comparator 13 (therefore accuracy of the output voltage Vout) is decreased.

Therefore, it is necessary to cancel the difference of the input offset between the comparators by a correction process. Therefore, when the switching power supply device 1 is activated, an initial correction process is performed in the following procedure.

Figure 7:
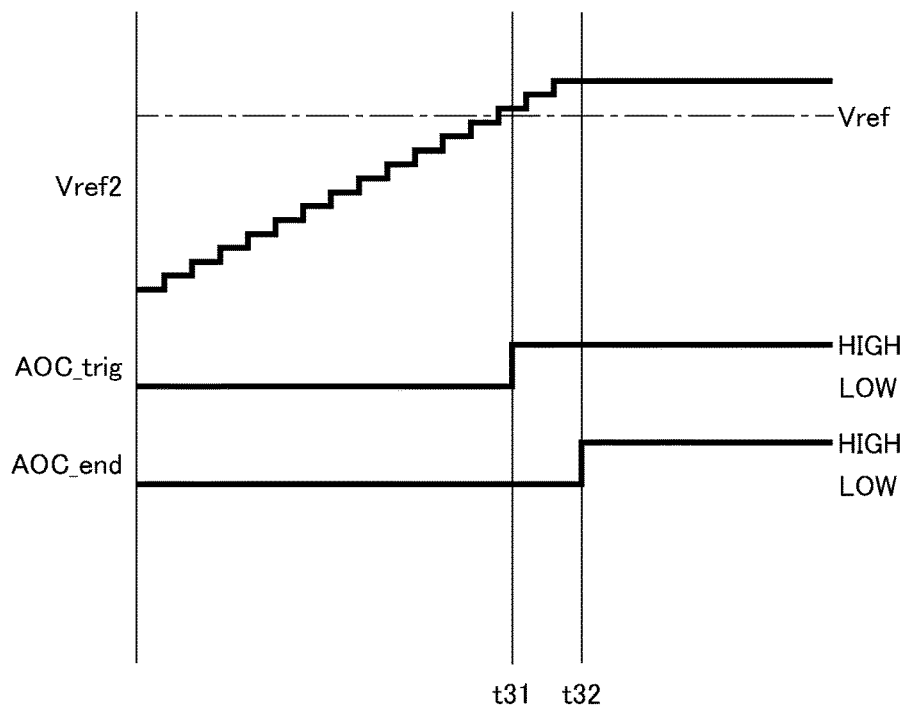
FIG. 7 is a timing chart of a count-up operation.
Figure 8:
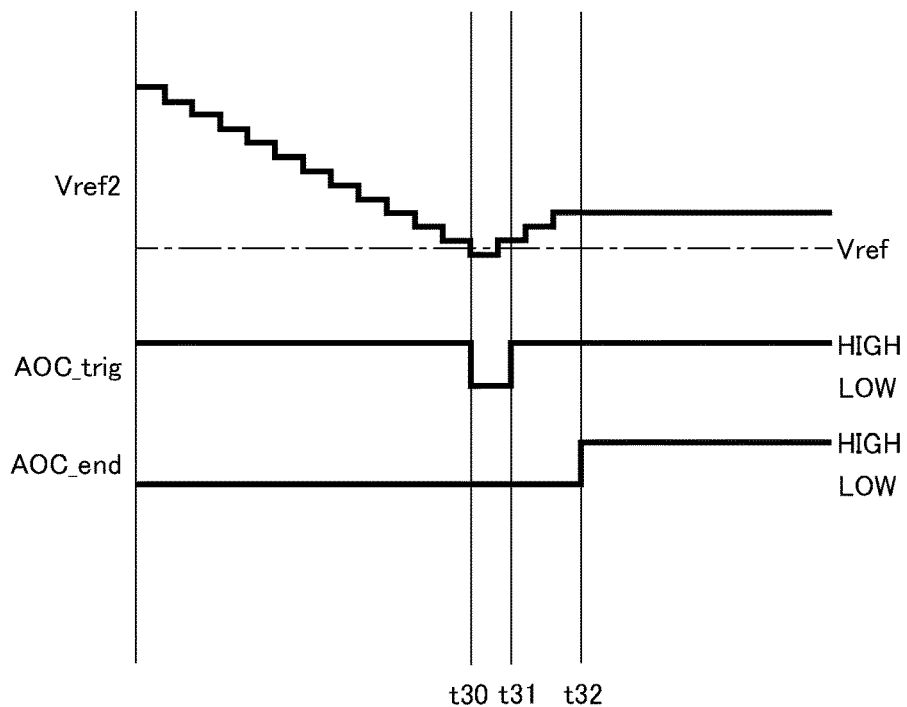
FIG. 8 is a timing chart of a count-down operation.

A trigger signal AOC_trig illustrated in FIGS. 7 and 8 is a logic signal indicating a magnitude relationship between the reference voltage Vref and the variable reference voltage Vref2.

When the switching power supply device 1 is activated, if the first comparator 131 responds before the second comparator 132 responds, the count-up operation as illustrated in FIG. 7 is performed in the initial correction process. As illustrated in FIG. 7, before time point t31, the trigger signal AOC_trig is maintained at low level during a period while the first comparator 131 responds before the second comparator 132 responds. On the other hand, at the time point t31, the variable reference voltage Vref2 becomes higher than the reference voltage Vref, and the second comparator 132 responds before the first comparator 131 responds. As a result, the second comparison signal S132 is decreased to low level before the first comparison signal S131 is decreased to low level, and the trigger signal AOC_trig is increased to high level.

It is possible to complete the increment of the counter value Scnt at this time point, but in the example of this chart, after the trigger signal AOC_trig is increased to high level, and further the increment of the counter value Scnt is continued for a period corresponding to n pulses of the output signal S4 (n is an integer of 2 or more). Then, at time point t32, when the (n+1)th pulse of the output signal S4 rises, an adjustment completion signal AOC_end is increased to high level.

When the switching power supply device 1 is activated, if the second comparator 132 responds before the first comparator 131 responds, the count-down operation as illustrated in FIG. 8 is performed in the initial correction process. As illustrated in FIG. 8, before time point t30, the trigger signal AOC_trig is maintained at high level for a period while the second comparator 132 responds before the first comparator 131 responds. On the other hand, at time point t30, the variable reference voltage Vref2 becomes lower than the reference voltage Vref, and the first comparator 131 responds before the second comparator 132 responds. As a result, when the first comparison signal S131 is decreased to low level before the second comparison signal S132 is decreased to low level, the trigger signal AOC_trig is decreased to low level. The process after time point t30 is the same as that illustrated in FIG. 7, and hence description thereof is omitted.

If only the initial correction process described above is performed, the input offset may be different between the first and second comparators 131 and 132 because of a change in an external environment (for example, power supply voltage, temperature, and the like) after the initial correction process. In addition, if inappropriate correction is performed in the initial correction process, different input offsets of the first and second comparators 131 and 132 are kept. Therefore, the switching power supply device 1 performs a first correction process and a second correction process after the initial correction process is finished, namely after the adjustment completion signal AOC_end becomes high level. Hereinafter, the first correction process and the second correction process are described in order.

<First Correction Process>

The first correction process is performed in a period while both the first comparator 131 and the second comparator 132 are operating before a period while only the second comparator 132 operates. In other words, the first correction process is performed in the case where the logic portion 134 sets the enable signal EN131 to the first logical level (i.e., logical level in enabled state). The first correction process is performed using a period while the first comparator 131 is operating based on a natural operation of the switching power supply device, which is not related to the first correction process, instead of operating the first comparator 131 only for the first correction process. In this way, it is possible to prevent increase of current consumption due to execution of the first correction process.

The logic portion 134 checks a level of the second comparison signal S132 output from the second comparator 132 when the feedback voltage Vfb is decreased to the same value as the reference voltage Vref, namely when the first comparison signal S131 output from the first comparator 131 is changed from high level to low level.

Figure 5:
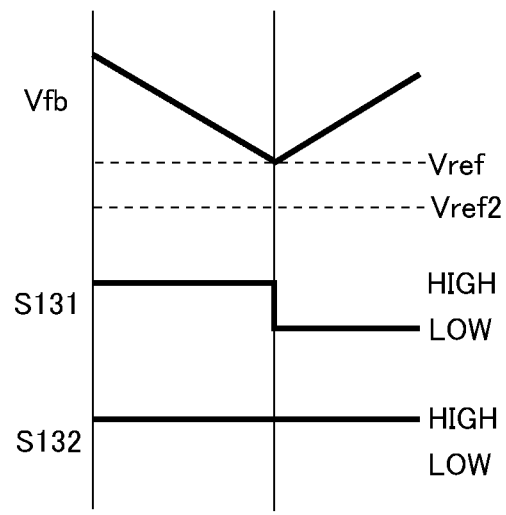
FIG. 5 is a timing chart illustrating a relationship among a feedback voltage, a reference voltage, and a variable reference voltage, and outputs of first and second comparators.
Figure 6:
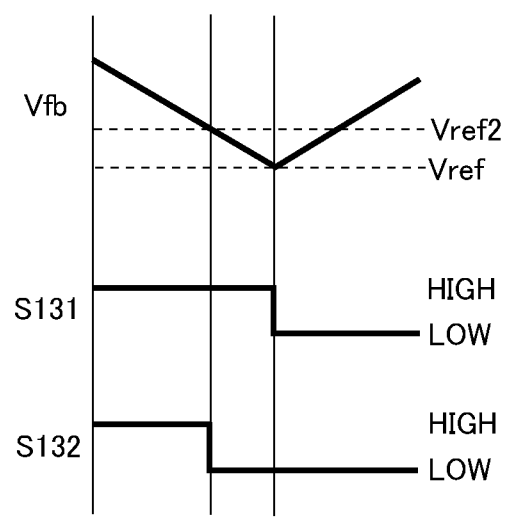
FIG. 6 is a timing chart illustrating the relationship among the feedback voltage, the reference voltage, and the variable reference voltage, and the outputs of the first and second comparators.

If the checked second comparison signal S132 is high level, the variable reference voltage Vref2 is lower than the reference voltage Vref as illustrated in FIG. 5. On the other hand, if the checked second comparison signal S132 is low level, the variable reference voltage Vref2 is higher than the reference voltage Vref as illustrated in FIG. 6. Therefore, the logic portion 134 checks a level of the second comparison signal S132 so as to check a magnitude relationship between the reference voltage and the variable reference voltage based on a level of the second comparison signal S132. Note that, in FIGS. 5 and 6, even if the feedback voltage Vfb becomes higher than the reference voltage Vref, the first comparison signal S131 is not promptly restored from low level to high level because of an influence of the response speed of the first comparator 131. Similarly in FIG. 6, even if the feedback voltage Vfb becomes higher than the variable reference voltage Vref2, the second comparison signal S132 is not promptly restored from low level to high level because of an influence of the response speed of the second comparator 132.

Further, if high level of the reverse current detection signal S5 continues for a second predetermined period of time (shorter than the first predetermined period of time, such as 4 μs) after the reverse current detection signal S5 is changed from low level to high level, the logic portion 134 starts the first correction process and finishes the first correction process before the first predetermined period of time (for example, 8 μs) elapses after the reverse current detection signal S5 is changed from low level to high level.

In the first correction process, if the second comparison signal S132 checked just before is high level, the logic portion 134 controls the up/down counter 133a to increment the counter value Scnt by the control signal S6.

On the other hand, in the first correction process, if the second comparison signal S132 checked just before is low level, the logic portion 134 controls the up/down counter 133a to decrement the counter value Scnt by the control signal S6.

<Second Correction Process>

The second correction process is performed when the state where only the second comparator 132 is operating is changed to the state where both the first comparator 131 and the second comparator 132 operate. In other words, the second correction process is performed when the logic portion 134 changes the enable signal EN131 from the second logical level (i.e., logical level in disabled state) to the first logical level (i.e., logical level in enabled state). The second correction process is performed using a period while the first comparator 131 is operating based on a natural operation of the switching power supply device, which is not related to the second correction process, instead of operating the first comparator 131 only for the second correction process. In this way, it is possible to prevent increase of current consumption due to execution of the second correction process.

The logic portion 134 detects that the feedback voltage Vfb is decreased to the same value as the variable reference voltage Vref2 in the state where only the second comparator 132 is operating, namely that the second comparison signal S132 output from the second comparator 132 is changed from the high level to the low level in the state where only the second comparator 132 is operating. Further, if the logic portion 134 detects it, it checks a level of the first comparison signal S131 output from the first comparator 131 when a predetermined delay time D elapses from the timing of detection.

At the time point when the second comparison signal S132 output from the second comparator 132 is changed from high level to low level, the first comparator 131 is stopped. The logic portion 134 activates the first comparator 131 by a trigger when the second comparison signal S132 output from the second comparator 132 is changed from high level to low level, and hence the predetermined delay time D is set to be longer than the time necessary for completing activation of the first comparator 131.

Figure 9:
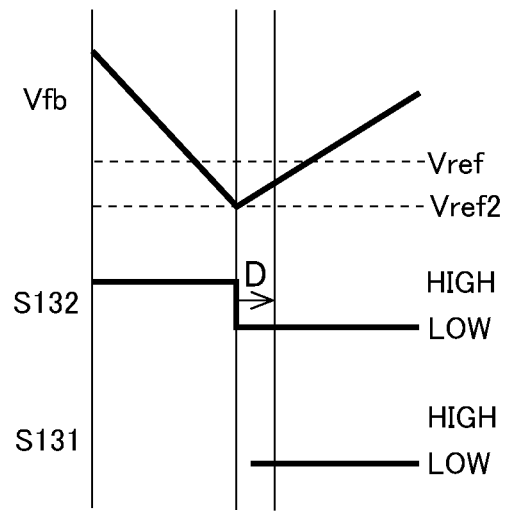
FIG. 9 is a timing chart illustrating the relationship among the feedback voltage, the reference voltage, and the variable reference voltage, and the outputs of the first and second comparators.
Figure 10:
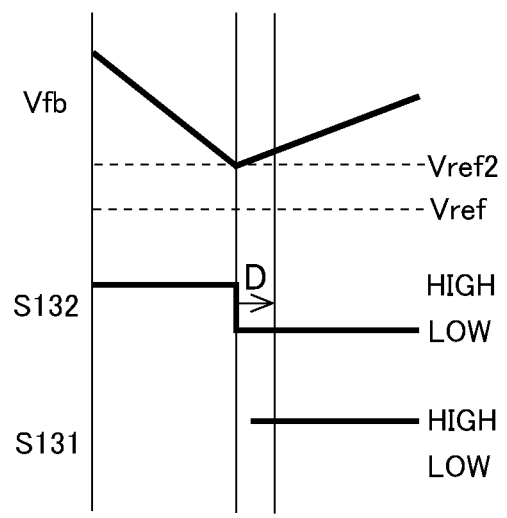
FIG. 10 is a timing chart illustrating the relationship among the feedback voltage, the reference voltage, and the variable reference voltage, and the outputs of the first and second comparators.

If the checked first comparison signal S131 is low level, the variable reference voltage Vref2 is lower than the reference voltage Vref as illustrated in FIG. 9. On the other hand, if the checked first comparison signal S131 is high level, the variable reference voltage Vref2 is higher than the reference voltage Vref as illustrated in FIG. 10. Therefore, the logic portion 134 checks a level of the first comparison signal S131 so as to check a magnitude relationship between the reference voltage and the variable reference voltage based on a level of the first comparison signal S131. Note that, in FIGS. 9 and 10, even if the feedback voltage Vfb becomes higher than the variable reference voltage Vref2, the second comparison signal S132 is not promptly restored from low level to high level because of an influence of the response speed of the second comparator 132.

Further, when the above-mentioned level check of the first comparison signal S131 is finished, the logic portion 134 performs the second correction process.

In the second correction process, if the first comparison signal S131 checked just before is low level, the logic portion 134 controls the up/down counter 133a to increment the counter value Scnt by the control signal S6.

On the other hand, in the second correction process, if the first comparison signal S131 checked just before is high level, the logic portion 134 controls the up/down counter 133a to decrement the counter value Scnt by the control signal S6.

Note that, in FIGS. 9 and 10, in the state where only the second comparator 132 is operating, the feedback voltage Vfb is increased at the timing when the second comparison signal S132 output from the second comparator 132 is changed from high level to low level. In other words, in the state where only the second comparator 132 is operating, switching of the transistors N1 and N2 is restarted at the timing when the second comparison signal S132 output from the second comparator 132 is changed from high level to low level.

On the contrary, in the state where only the second comparator 132 is operating, it is possible to maintain OFF states of the transistors N1 and N2 also after the timing when the second comparison signal S132 output from the second comparator 132 is changed from high level to low level and to restart the switching of the transistors N1 and N2 after the second correction process is completed. In this way, it is possible to prevent the second correction process from being badly affected by the switching of the transistors N1 and N2.

<Variation of Main Comparator>

Figure 11:
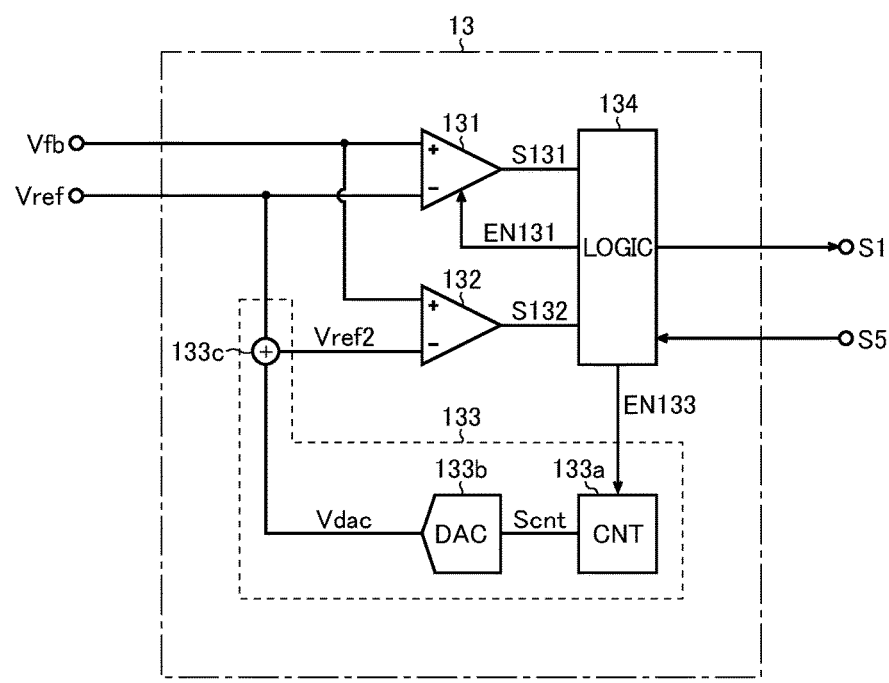
FIG. 11 is a block diagram illustrating another structural example of the main comparator 13.

FIG. 11 is a circuit diagram illustrating a variation of the main comparator 13. The main comparator 13 of this variation has a structure in which an adding portion 133c is additionally provided to the structural example (FIG. 4) described above as a base. Therefore, the same circuit elements as those in the structural example described above are denoted by the same numerals as FIG. 4, and hence overlapping description is omitted. In the following description, a characterized part of the variation is mainly described.

The adding portion 133c adds the analog voltage Vdac to the reference voltage Vref so as to generate the variable reference voltage Vref2 (=Vref+Vdac) and outputs the variable reference voltage Vref2 to the inverting input terminal (−) of the second comparator 132.

In other words, the analog voltage Vdac is used not as the variable reference voltage Vref2 itself but as an offset voltage that is added to the reference voltage Vref. Note that, as to the analog voltage Vdac, an analog output value corresponding to the counter value Scnt is set so that the variable reference voltage Vref2 can have positive and negative voltage values with respect to the reference voltage Vref.

With this structure, offset adjustment of the second comparator 132 can be performed with respect to a median value that is the reference voltage Vref input to the first comparator 131.

<Application to Television Set>

Figure 12:
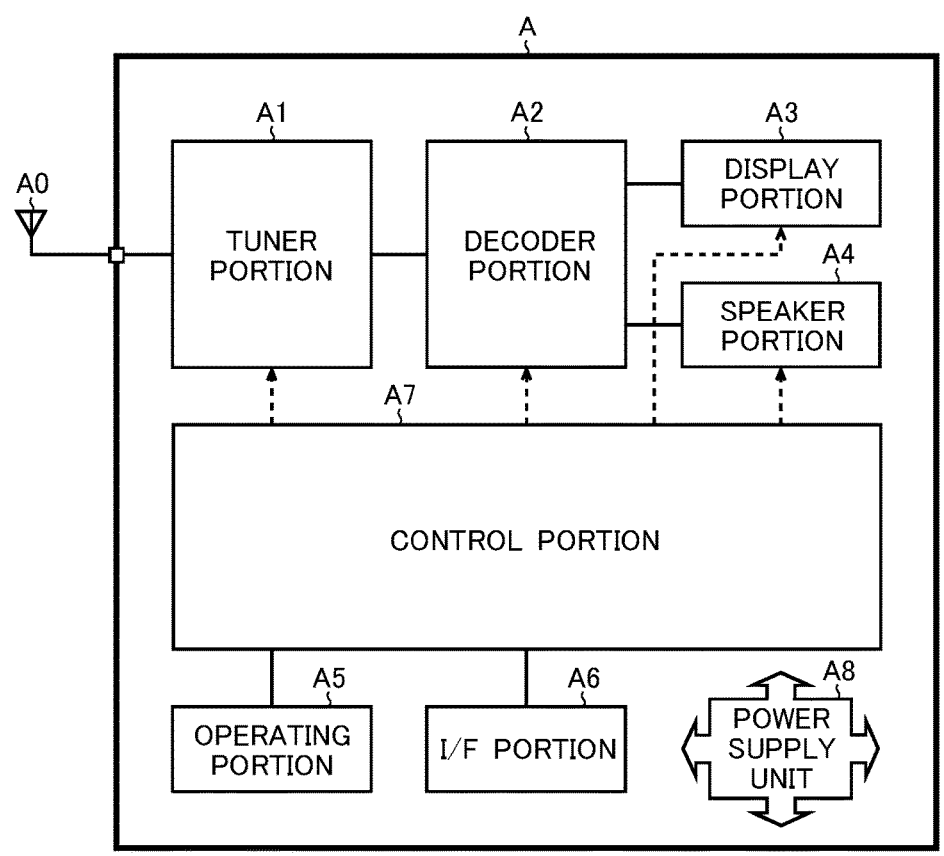
FIG. 12 is a block diagram illustrating a structural example of a television set including the switching power supply device.
Figure 13A:
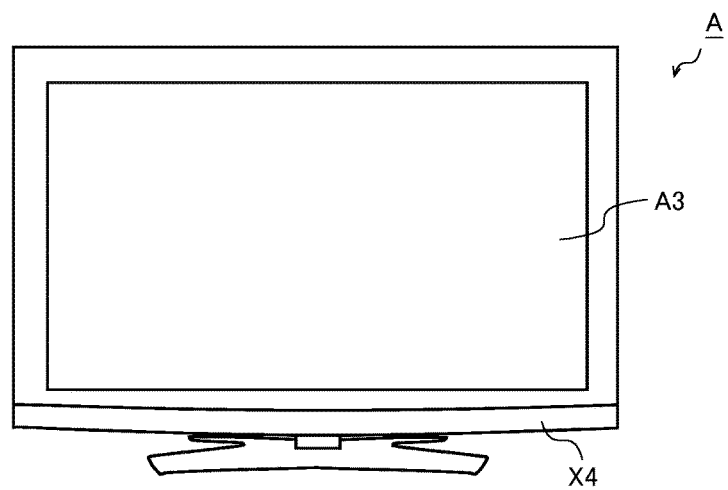
FIG. 13A is a front view of the television set including the switching power supply device.
Figure 13B:
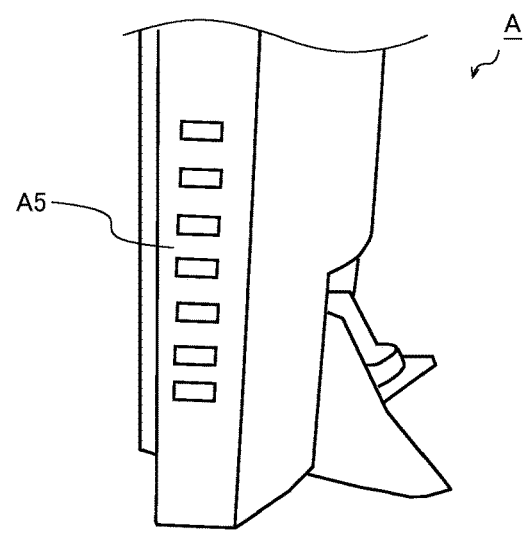
FIG. 13B is a side view of the television set including the switching power supply device.
Figure 13C:
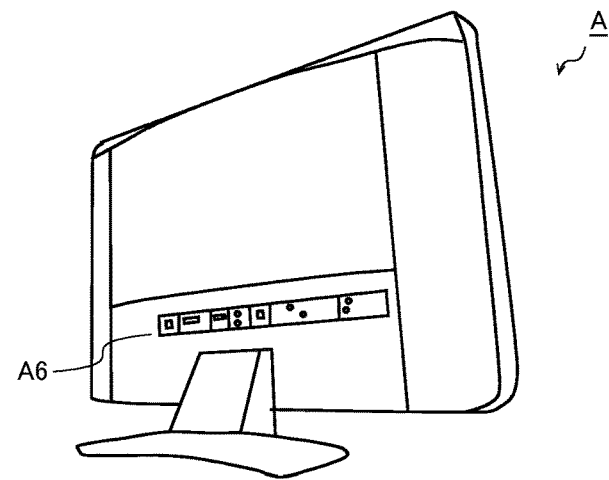
FIG. 13C is a rear view of the television set including the switching power supply device.

FIG. 12 is a block diagram illustrating a structural example of a television set including the switching power supply device described above. In addition, FIGS. 13A to 13C respectively illustrate a front view, a side view, and a rear view of the television set including the switching power supply device described above. A television set A of this structural example includes a tuner portion A1, a decoder portion A2, a display portion A3, a speaker portion A4, an operating portion A5, an interface portion A6, a control portion A7, and a power supply unit A8.

The tuner portion A1 selects a broadcasting signal of a desired channel from a reception signal received by an antenna A0 externally connected to the television set A.

The decoder portion A2 generates a video signal and an audio signal from the broadcasting signal selected by the tuner A1. In addition, the decoder portion A2 also has a function of generating the video signal and the audio signal based on an external input signal from the interface portion A6.

The display portion A3 outputs an image of the video signal generated by the decoder portion A2.

The speaker portion A4 outputs sound of the audio signal generated by the decoder portion A2.

The operating portion A5 is a human interface that receives a user's operation. As the operating portion A5, buttons, switches, a remote controller and the like can be used.

The interface portion A6 is a front-end that receives an external input signal from an external device (an optical disc player, a hard disk drive, or the like).

The control portion A7 integrally controls operations of the individual portions A1 to A6 described above. As the control portion A7, a central processing unit (CPU) or the like can be used.

The power supply unit A8 supplies electric power to the individual portions A1 to A7. As the power supply unit A8, the switching power supply device 1 described above can be appropriately used.

<Other Variations>

Note that the structure in which the present invention is applied to the step-down type switching power supply device is exemplified in the embodiment described above, but the application of the present invention is not limited to this. For example, the present invention can be applied to a switching power supply device having an output stage of a step-up type, a step-up/down type, or an inversion type.

In addition, the fixed on-time type switching power supply device (on-time setting circuit) is exemplified in the embodiment described above, but the application of the present invention is not limited to this. It is also possible to apply the present invention to a fixed off-time type switching power supply device by changing behavior of the variable reference voltage Vref2 based on the same technical concept as described above.

In addition, the switching power supply device in which both the first correction process and the second correction process are performed is exemplified in the embodiment described above, but it is possible to perform only one of the first correction process and the second correction process in the switching power supply device, though execution frequency of the correction process is a little decreased.

In this way, other than the embodiment described above, the structure of the present invention can be modified variously within the scope of the invention without deviating from the spirit thereof. In other words, the embodiment described above is merely an example in every aspect and should not be interpreted as a limitation. The technical scope of the present invention is defined not by the above description of the embodiment but by the claims and should be understood to include all modifications within meanings and scopes equivalent to the claims.

INDUSTRIAL APPLICABILITY

The switching power supply device can be used as a power supply mounted in various electronic equipment such as a liquid crystal display, a plasma display, a BD recorder/player, a set top box, and a personal computer (for example, as a power supply for system-on-chip (SOC) or a power supply for peripheral equipment).

SUMMARY

An example of the comparator circuit described above, which is disposed in a nonlinear control type switching power supply device arranged to generate a desired output voltage from an input voltage and receives the output voltage or a feedback voltage corresponding thereto as an input signal, includes a first comparator arranged to compare the input signal with a reference voltage so as to generate a first comparison signal; a second comparator arranged to compare the input signal with a variable reference voltage so as to generate a second comparison signal; a variable reference voltage generating portion arranged to generate the variable reference voltage; and a logic portion arranged to output one of the first comparison signal and the second comparison signal as a comparison signal. The logic portion adjusts the variable reference voltage to become close to the reference voltage during a period from a time point when reverse current of current flowing in a coil disposed in the switching power supply device is detected in a state where the first comparison signal is output as the comparison signal while the first comparator and the second comparator are operated, until a first predetermined period of time elapses in a state where switching operation of the switching power supply device is stopped (excluding a period from a time point when the reverse current is detected until a second predetermined period of time shorter than the first predetermined period of time elapses) (first structure).

The comparator circuit having the first structure described above may have a structure, in which the logic portion checks a magnitude relationship between the reference voltage and the variable reference voltage based on a level of the second comparison signal at a time point when a level of the first comparison signal is changed, in the state where the first comparison signal is output as the comparison signal while the first comparator and the second comparator are operated, and adjusts the variable reference voltage in accordance with the magnitude relationship (second structure).

Another example of the comparator circuit described above, which is disposed in a nonlinear control type switching power supply device arranged to generate a desired output voltage from an input voltage and receives the output voltage or a feedback voltage corresponding thereto as an input signal, includes a first comparator arranged to compare the input signal with a reference voltage so as to generate a first comparison signal; a second comparator arranged to compare the input signal with a variable reference voltage so as to generate a second comparison signal; a variable reference voltage generating portion arranged to generate the variable reference voltage; and a logic portion arranged to output one of the first comparison signal and the second comparison signal as a comparison signal. The logic portion adjusts the variable reference voltage to become close to the reference voltage when switching from a state where the second comparison signal is output as the comparison signal while the first comparator is stopped and the second comparator is operated to a state where the first comparison signal is output as the comparison signal while the first comparator and the second comparator are operated (third structure).

The comparator circuit having the third structure described above may have a structure, in which the logic portion checks a magnitude relationship between the reference voltage and the variable reference voltage based on a level of the first comparison signal when a predetermined delay time elapses from a time point when a level of the second comparison signal is changed, in a state where the second comparison signal is output as the comparison signal while the first comparator is stopped and the second comparator is operated, and adjusts the variable reference voltage in accordance with the magnitude relationship (fourth structure).

In the comparator circuit having the fourth structure described above, switching operation of the switching power supply device may be restarted after the adjustment of the variable reference voltage is completed (fifth structure).

The comparator circuit having any one of the first to fifth structures described above may have a structure in which the first comparator has faster response speed than the second comparator, and the second comparator has smaller power consumption than the first comparator (sixth structure).

The comparator circuit having any one of the first to sixth structures described above may have a structure in which the variable reference voltage generating portion includes an up/down counter, and a digital to analog converter (DAC) arranged to convert a counter value of the up/down counter into an analog voltage, so as to output the analog voltage or a voltage corresponding thereto as the variable reference voltage (seventh structure).

In the comparator circuit having the seventh structure described above, the variable reference voltage generating portion may further include an adding portion arranged to add the analog voltage to the reference voltage so as to generate the variable reference voltage (eighth structure).

In addition, the power supply control IC described above includes integration of a ripple injection circuit arranged to superimpose a ripple voltage simulating coil current to an output voltage or a divided voltage thereof so as to generate a feedback voltage; a reference voltage generating circuit arranged to generate a predetermined reference voltage; a main comparator arranged to compare the feedback voltage with the reference voltage so as to generate a comparison signal; a one-shot pulse generating circuit arranged to generate a one-shot pulse in a set signal in response to the comparison signal; an RS flip-flop arranged to set an output signal to a first logical level in response to the set signal and to reset the output signal to a second logical level in response to a reset signal; an on-time setting circuit arranged to generate a one-shot pulse in the reset signal at a time point when a predetermined on-time elapses after the output signal is set to the first logical level; a gate driver circuit arranged to generate drive signals for an output transistor and a synchronous rectification transistor in response to the output signal; and a reverse current detecting circuit arranged to detect reverse current of the coil current so as to forcibly turn off the synchronous rectification transistor, in which the power supply control IC includes the comparator circuit having any one of the first to eighth structures described above as the main comparator (ninth structure).

In addition, the switching power supply device described above includes the power supply control IC having the ninth structure described above, and a switch output stage arranged to generate an output voltage from an input voltage, a part or a whole of the switch output stage being externally connected to the power supply control IC (tenth structure).

What is claimed is:

1. A comparator circuit disposed in a switching power supply device arranged to generate a desired output voltage from an input voltage, the comparator circuit receiving the output voltage or a feedback voltage corresponding thereto as an input signal, the comparator circuit comprising:
   a first comparator arranged to compare the input signal with a reference voltage so as to generate a first comparison signal;
   a second comparator arranged to compare the input signal with a variable reference voltage so as to generate a second comparison signal;
   a variable reference voltage generating portion arranged to generate the variable reference voltage; and
   a logic portion arranged to output one of the first comparison signal and the second comparison signal as a comparison signal, wherein
   the logic portion is operable to adjust the variable reference voltage such that logical switching timing of the second comparison signal becomes close to logical switching timing of the first comparison signal during a first period from a time point when reverse current of current flowing in a coil disposed in the switching power supply device is detected in a state where the first comparison signal is output as the comparison signal while the first comparator and the second comparator are operated, until a first predetermined period of time elapses.

2. The comparator circuit according to claim 1, wherein the logic portion checks a magnitude relationship between the reference voltage and the variable reference voltage based on a level of the second comparison signal at a time point when a level of the first comparison signal is changed, in the state where the first comparison signal is output as the comparison signal while the first comparator and the second comparator are operated, and adjusts the variable reference voltage in accordance with the magnitude relationship.

3. The comparator circuit according to claim 1, wherein the first comparator has faster response speed than the second comparator, and the second comparator has smaller power consumption than the first comparator.

4. The comparator circuit according to claim 1, wherein the variable reference voltage generating portion includes an up/down counter, and a digital to analog converter (DAC) arranged to convert a counter value of the up/down counter into an analog voltage, so as to output the analog voltage or a voltage corresponding thereto as the variable reference voltage.

5. The comparator circuit according to claim 4, wherein the variable reference voltage generating portion further includes an adding portion arranged to add the analog voltage to the reference voltage so as to generate the variable reference voltage.

6. A power supply control IC comprising integration of:
   a ripple injection circuit arranged to superimpose a ripple voltage simulating coil current to an output voltage or a divided voltage thereof so as to generate a feedback voltage;
   a reference voltage generating circuit arranged to generate a predetermined reference voltage;
   a main comparator arranged to compare the feedback voltage with the reference voltage so as to generate a comparison signal;
   a one-shot pulse generating circuit arranged to generate a one-shot pulse in a set signal in response to the comparison signal;
   an RS flip-flop arranged to set an output signal to a first logical level in response to the set signal and to reset the output signal to a second logical level in response to a reset signal;
   an on-time setting circuit arranged to generate a one-shot pulse in the reset signal at a time point when a predetermined on-time elapses after the output signal is set to the first logical level;
   a gate driver circuit arranged to generate drive signals for an output transistor and a synchronous rectification transistor in response to the output signal; and
   a reverse current detecting circuit arranged to detect reverse current of the coil current so as to forcibly turn off the synchronous rectification transistor, wherein
   the power supply control IC includes the comparator circuit according to claim 1 as the main comparator.

7. A switching power supply device comprising:
   the power supply control IC according to claim 6; and
   a switch output stage arranged to generate an output voltage from an input voltage, a part or a whole of the switch output stage being externally connected to the power supply control IC.

8. The comparator circuit according to claim 1, wherein the first period does not include a period from a time point when the reverse current is detected until a lapse of a second predetermined period of time shorter than the first predetermined period of time.

9. The comparator circuit according to claim 1, wherein the first period is a period from the time point when reverse current of current flowing in the coil disposed in the switching power supply device is detected in the state where the first comparison signal is output as the comparison signal while the first comparator and the second comparator are operated, until a lapse of the first predetermined period of time in a state where switching operation of the switching power supply device is stopped.

10. A comparator circuit disposed in a switching power supply device arranged to generate a desired output voltage from an input voltage, the comparator circuit receiving the output voltage or a feedback voltage corresponding thereto as an input signal, the comparator circuit comprising:
a first comparator arranged to compare the input signal with a reference voltage so as to generate a first comparison signal;
a second comparator arranged to compare the input signal with a variable reference voltage so as to generate a second comparison signal;
a variable reference voltage generating portion arranged to generate the variable reference voltage; and
a logic portion arranged to output one of the first comparison signal and the second comparison signal as a comparison signal, wherein
the logic portion is operable to adjust the variable reference voltage such that logical switching timing of the second comparison signal becomes close to logical switching timing of the first comparison signal when switching from a first state where the second comparison signal is output as the comparison signal while the first comparator is stopped and the second comparator is operated to a second state where the first comparator and the second comparator are operated.

11. The comparator circuit according to claim 10, wherein the logic portion checks a magnitude relationship between the reference voltage and the variable reference voltage based on a level of the first comparison signal when a predetermined delay time elapses from a time point when a level of the second comparison signal is changed, in a state where the second comparison signal is output as the comparison signal while the first comparator is stopped and the second comparator is operated, and adjusts the variable reference voltage in accordance with the magnitude relationship.

12. The comparator circuit according to claim 11, wherein switching operation of the switching power supply device is restarted after the adjustment of the variable reference voltage is completed.

13. The comparator circuit according to claim 10, wherein the first comparator has faster response speed than the second comparator, and the second comparator has smaller power consumption than the first comparator.

14. The comparator circuit according to claim 10, wherein the variable reference voltage generating portion includes an up/down counter, and a digital to analog converter (DAC) arranged to convert a counter value of the up/down counter into an analog voltage, so as to output the analog voltage or a voltage corresponding thereto as the variable reference voltage.

15. The comparator circuit according to claim 14, wherein the variable reference voltage generating portion further includes an adding portion arranged to add the analog voltage to the reference voltage so as to generate the variable reference voltage.

16. A power supply control IC comprising integration of:
a ripple injection circuit arranged to superimpose a ripple voltage simulating coil current to an output voltage or a divided voltage thereof so as to generate a feedback voltage;
a reference voltage generating circuit arranged to generate a predetermined reference voltage;
a main comparator arranged to compare the feedback voltage with the reference voltage so as to generate a comparison signal;
a one-shot pulse generating circuit arranged to generate a one-shot pulse in a set signal in response to the comparison signal;
an RS flip-flop arranged to set an output signal to a first logical level in response to the set signal and to reset the output signal to a second logical level in response to a reset signal;
an on-time setting circuit arranged to generate a one-shot pulse in the reset signal at a time point when a predetermined on-time elapses after the output signal is set to the first logical level;
a gate driver circuit arranged to generate drive signals for an output transistor and a synchronous rectification transistor in response to the output signal; and
a reverse current detecting circuit arranged to detect reverse current of the coil current so as to forcibly turn off the synchronous rectification transistor, wherein
the power supply control IC includes the comparator circuit according to claim 10 as the main comparator.

17. A switching power supply device comprising:
the power supply control IC according to claim 16; and
a switch output stage arranged to generate an output voltage from an input voltage, a part or a whole of the switch output stage being externally connected to the power supply control IC.

18. The comparator circuit according to claim 10, wherein the second state is a state where the first comparison signal is output as the comparison signal while the first comparator and the second comparator are operated.

* * * * *